US008248176B2

(12) United States Patent
Takano et al.

(10) Patent No.: US 8,248,176 B2
(45) Date of Patent: Aug. 21, 2012

(54) CURRENT SOURCE CIRCUIT AND DELAY CIRCUIT AND OSCILLATING CIRCUIT USING THE SAME

(75) Inventors: Yoichi Takano, Tokyo (JP); Koichi Yamaguchi, Tokyo (JP); Koichi Kuwahara, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 16 days.

(21) Appl. No.: 12/962,698

(22) Filed: Dec. 8, 2010

(65) Prior Publication Data

US 2011/0156822 A1    Jun. 30, 2011

(30) Foreign Application Priority Data

Dec. 25, 2009 (JP) .................................. 2009-293767
Jun. 29, 2010 (JP) .................................. 2010-147588

(51) Int. Cl.
*H03L 5/00* (2006.01)
*G01J 5/00* (2006.01)

(52) U.S. Cl. ............ 331/183; 331/66; 331/176; 331/57; 327/513

(58) Field of Classification Search .................... 331/57, 331/66, 176, 183; 327/513
See application file for complete search history.

(56) References Cited

U.S. PATENT DOCUMENTS

| 6,356,161 B1 * | 3/2002 | Nolan et al. ................... 331/176 |
| 7,777,555 B2 * | 8/2010 | Liao et al. ..................... 327/513 |
| 8,041,294 B2 * | 10/2011 | Rofougaran et al. ........... 455/20 |

FOREIGN PATENT DOCUMENTS

JP    2002-236521    8/2002

* cited by examiner

*Primary Examiner* — Arnold Kinkead
(74) *Attorney, Agent, or Firm* — IPUSA, PLLC

(57) ABSTRACT

A disclosed current source circuit includes a current mirror circuit having two enhancement-type MOS transistors, a depletion-type MOS transistor configured to be connected to a drain of one of the two enhancement-type MOS transistors and to function as a constant current source, and a resistor configured to have a negative temperature property and be connected to a source of the one of the two enhancement-type MOS transistors.

9 Claims, 16 Drawing Sheets

_US 8,248,176 B2_

CURRENT SOURCE CIRCUIT AND DELAY CIRCUIT AND OSCILLATING CIRCUIT USING THE SAME

CROSS-REFERENCE TO RELATED APPLICATIONS

This patent application is based upon and claims the benefit of priority of Japanese Patent Application No. 2009-293767 filed on Dec. 25, 2009 and Japanese Patent Application No. 2010-147588 filed on Jun. 29, 2010 the entire contents of which are incorporated herein by reference.

BACKGROUND OF THE INVENTION

1. Field of the Invention

The present invention generally relates to a current source circuit using a depletion-type metal oxide semiconductor (MOS), and a delay circuit and an oscillating circuit using the depletion-type metal oxide semiconductor (MOS).

2. Description of the Related Art

A depletion-type metal oxide semiconductor (MOS) has various usages such as a current source circuit.

FIG. 26A is an example current source circuit using a depletion-type metal oxide semiconductor. Referring to FIG. 26A, a drain of the depletion-type N-channel MOS transistor 1 is connected to a positive pole, and a negative pole of a direct-current power source 2 is grounded. The source and the gate of the MOS transistor 1 are mutually connected and further connected to a terminal 3. The current source circuit applies a constant electric current to the terminal 3.

Referring to FIG. 26B, the drain of an N-channel MOS transistor 1 is connected to a terminal 4. The source and the gate of the MOS transistor 1 are mutually connected and further grounded. The current source circuit applies a constant electric current to the terminal 4.

There is a known technique that a resistor and an enhancement MOS transistor are used to compensate for a current-temperature property of a depletion-type N-channel MOS transistor (see Patent Document 1).

In the example circuits illustrated in FIG. 26A and FIG. 26B, the depletion-type N-channel MOS transistor has a positive temperature property in which the drain current increases when the temperature increases. FIG. 27 illustrates a drain-temperature property of the depletion-type MOS transistor. As illustrated, since the current source circuit using the example depletion-type MOS transistor illustrated in FIG. 26A and FIG. 26B has a positive temperature property, it is necessary to compensate for the temperature property in order to flatten the temperature property of the current source circuit.

[Patent Document 1] Japanese Unexamined Patent Application Publication No. 2002-236521

SUMMARY OF THE INVENTION

Accordingly, embodiments of the present invention may provide a novel and useful current source circuit which can compensate for a temperature property of a depletion-type MOS transistor solving one or more of the problems discussed above with a simple structure.

More specifically, the embodiments of the present invention may provide a current source circuit including a current mirror circuit having two enhancement-type MOS transistors, a depletion-type MOS transistor configured to be connected to a drain of one of the two enhancement-type MOS transistors and to function as a constant current source, and a resistor configured to have a negative temperature property and be connected to a source of the one of the two enhancement-type MOS transistors.

Another aspect of the present invention may be to provide the current source circuit wherein the resistor is made of polysilicon.

Another aspect of the present invention may be to provide the current source circuit according to the preceding aspect including an adjusting circuit including a plurality of MOS transistors connected to the one of the enhancement-type MOS transistor in series or in parallel or a plurality of resistors connected to the resistor having the negative temperature property, and a plurality of fuses connected to the plurality of MOS transistors or the plurality of resistors one-on-one.

Another aspect of the present invention may be to provide the current source circuit according to the preceding aspects wherein the two enhancement-type MOS transistors are attributed to a P-channel type, the resistor is interposed between the source of the one of the two enhancement-type MOS transistors and a power supply line, the depletion-type MOS transistor is attributed to a N-channel type and a drain of the depletion-type MOS transistor is connected to the drain of the one of the two enhancement-type MOS transistors, a source of the depletion-type MOS transistor is grounded, and a current is output from a drain of another one of the two enhancement-type MOS transistors.

Another aspect of the present invention may be to provide the current source circuit including the current mirror circuit according to the preceding aspects, a second resistor having a positive temperature coefficient configured to be interposed between the source of the other one of the two enhancement-type MOS transistors and the power supply line, a second current mirror circuit including two P-channel MOS transistors configured to be provided separate from the current source circuit, a constant current circuit interposed between an output of the current source circuit and a drain of one of the two P-channel MOS transistors, the constant current circuit including a third resistor connected to the drain of the one of the two enhancement-type MOS transistors, a fourth resistor made of a material of a similar kind to a material of the third resistor and connected to a drain of the one of the two P-channel MOS transistors via a driving transistor configured to drive the second current mirror circuit and to determine an input current to the second current mirror circuit, and an operational amplifier interposed between the drain of the one of the two enhancement-type MOS transistors and a gate of the driving transistor, wherein the drain of the one of the two enhancement-type MOS transistors is connected to a noninverting input terminal of the operational amplifier, the gate of the driving transistor is connected to an output terminal of the amplifier, and a source of the driving transistor is connected to an inverting input terminal.

Another aspect of the present invention may be to provide a delay circuit which causes a delay from a start of charging with electricity to a delayed output by a predetermined time, the delay circuit including the current source circuit according to the preceding aspect, a capacitor configured to be charged with an output current from the current source circuit, and a comparator configured to output a comparative result as the delayed output by comparing a charging voltage of the capacitor with a predetermined threshold.

Another aspect of the present invention may be to provide an oscillating circuit including the current source circuit according to the preceding aspects, a capacitor configured to be charged by an output current from the current source circuit, a first switch configured to discharge the capacitor, a comparator configured to compare a charging voltage of the capacitor with a first threshold or a second threshold and output a comparative example, and a second switch configured to generate any one of the first threshold and the second threshold to be supplied to the comparator, wherein turning-on of the first switch or the second switch is determined depending on the comparative example output from the comparator.

Another aspect of the present invention may be to provide an oscillating circuit including the current source circuit according to the preceding aspects, a plurality of inverters and an output inverter, connected in a form of a ring, to which an operation current is supplied from the current source circuit, and a plurality of capacitors provided between the plurality of inverters and the output inverter while maintaining a predetermined potential in the plurality of capacitors.

Another aspect of the present invention may be to provide an oscillating circuit including the current source circuit according to the preceding aspects, a capacitor configured to be charged by an output current from the current source circuit, a comparator configured to compare the voltage of the capacitor with a predetermined reference voltage, and a switching element configured to discharge an electric charge in the charged capacitor based on a result of the comparing obtained by the comparator.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 1 through FIG. 27 of embodiments of the present invention. Hereinafter, reference symbols typically designate as follows.
C, C1-C6: Capacitor;
E1: Direct-current power source;
F1-1-F1-$n$: Fuse;
Q1, M1: Depletion-type N-channel MOS transistor;
Q2, Q3, Q12, Q13, M2, M3, M4, M5, M6: MOS transistor;
R, R11-R13, R21-R26: Resistor;
11, Vf, OUT: Terminal;
20, 40: Current source circuit;
21: Comparator;
22: Comparator;
24, 25, 26, 27: Inverter;
28: Ring oscillator;
50: Oscillating circuit;
51: Comparator; and
52: Reference voltage generating unit.

Embodiment 1

Figure 1:
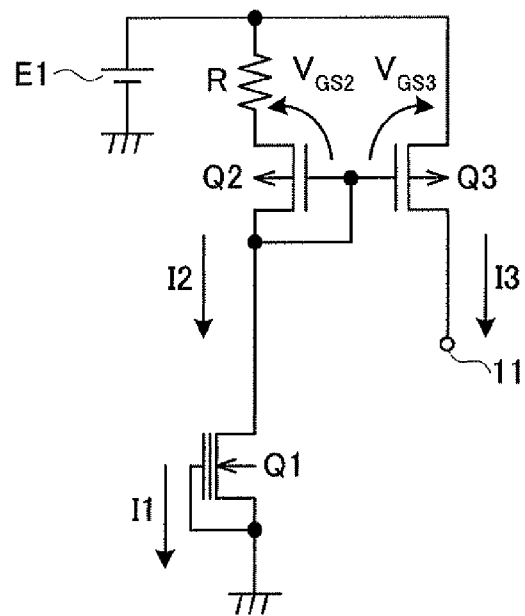
FIG. 1 is a circuit diagram of a current source circuit of Embodiment 1.

<Circuit Diagram of a Current Source Circuit>
FIG. 1 is a circuit diagram of a current source circuit of one embodiment. Referring to FIG. 1, the drain of a depletion-type N-channel MOS transistor Q1 is connected to the drain of an enhancement-type P-channel MOS transistor Q2. The source and the gate of the MOS transistor Q1 are mutually connected and further grounded.

The drain and gate of the MOS transistor Q2 are connected to the gate of the enhancement-type P-channel MOS transistor Q3, and the MOS transistors Q2 and Q3 form a current mirror circuit. The source of the MOS transistor Q2 is connected to an end of the resistor R, the other end of the resistor R is connected to the positive pole of a direct-current source E1, and the negative pole of the direct-current source E1 is grounded. The source of the MOS transistor Q3 is connected to the positive pole of the direct-current power source E1, and the drain of the MOS transistor Q3 is connected to the terminal 11. The current source circuit of FIG. 1 is a circuit for supplying a constant current to the terminal 11, and this current source circuit is made by a semiconductor integrated circuit.

The depletion-type N-channel MOS transistor Q1 functions as a constant current source and determines an input current (reference current) of the current mirror circuit.

Figure 2:
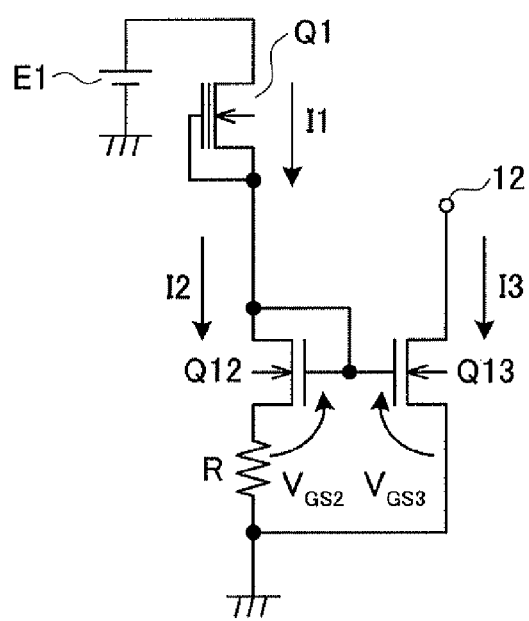
FIG. 2 is a circuit diagram of the current source circuit of another mode of Embodiment 1.

FIG. 2 is a circuit diagram of a current source circuit of another mode of Embodiment 1. Referring to FIG. 2, the same reference symbols as those in FIG. 1 are attached to the same portions. Referring to FIG. 2, the drain of a depletion-type N-channel MOS transistor Q1 is connected to the positive pole of a direct-current power source E1, and a negative pole of the direct-current power source E1 is grounded. The source and gate of the MOS transistor Q1 are mutually connected and further connected to the drain of an enhancement-type N-channel MOS transistor Q12.

Figure 3:
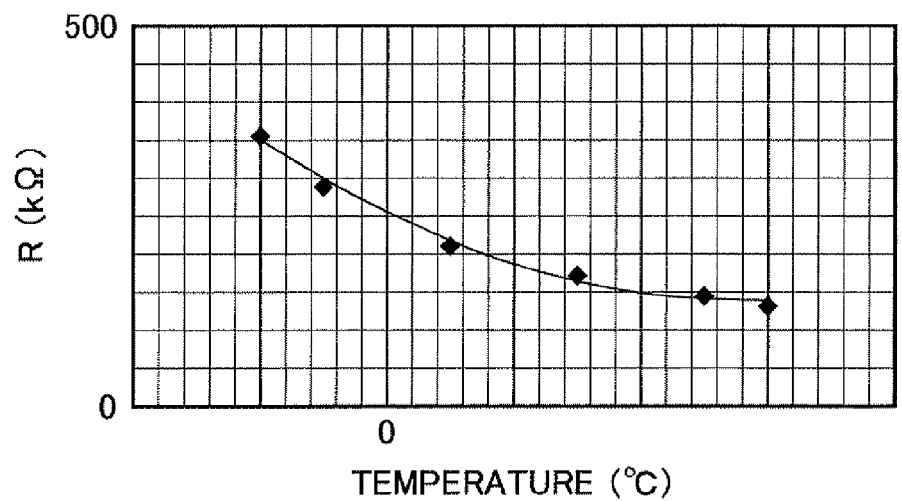
FIG. 3 illustrates a resistance value-temperature property of a polysilicon resistor.

The drain and gate of the enhancement-type MOS transistor Q12 are connected to the gate of the N-channel MOS transistor Q13. The MOS transistors Q12 and Q13 form a current mirror circuit. The source of the MOS transistor Q12 is connected to one end of the resistor R. The other end of the resistor R is grounded. The source of the MOS transistor Q13 is grounded, and the drain of the MOS transistor Q13 is connected to the terminal 12. The current source circuit of FIG. 2 is a circuit for drawing (pulling) a constant current from the terminal 12, and is made of a semiconductor integrated circuit Referring to FIG. 1 and FIG. 2, the resistor R is made of polysilicon, and the polysilicon resistor has a negative temperature property as illustrated in FIG. 3. The negative temperature property means that a resistance value decreases when a temperature of the resistor increases.

A negative temperature property means that the resistance value increases when the temperature of the resistor increases. A negative temperature coefficient designates a rate with which a resistance value decreases when a temperature of the resistor increases. A positive temperature property means that the resistance value increases when the temperature of the resistor increases. A positive temperature coefficient designates a rate with which a resistance value increases when a temperature of the resistor increases.
<Temperature Compensation of a Current Source Circuit>

The drain current ID of the MOS transistor is ordinarily expresses by Formula 1. Hereinafter, a reference symbol us designates a surface mobility, a reference symbol Co designates a gate capacity per a unit area, a reference symbol W/L designates a MOS gate size, a reference symbol VGS designates a gate-source voltage, and a reference symbol VT designates a threshold voltage.

$$ID = (½) \times \mu s \times Co \times (W/L) \times (VGS - VT)^2 \quad \text{Formula 1}$$

When suffixes 1, 2, 3 . . . are attached to W/L and VGS in order to indicate correspondences between the suffixes and the transistors Q1, Q2, Q3, . . . , the drain current I2, I3 of the MOS transistors I2 and I3 are expressed by Formulas 2 and 3.

$$I2 = (½) \times \mu s \times Co \times (W2/L2) \times (VGS2 - VT)^2 \quad \text{Formula 2}$$

$$I3 = (½) \times \mu s \times Co \times (W3/L3) \times (VGS3 - VT)^2 \quad \text{Formula 3}$$

In the current mirror circuit including MOS transistors Q2 and Q3, Formula 4 is obtainable. A reference symbol R designates a resistance value of the resistor R.

$$VGS3 = VGS2 + R \times I2 \quad \text{Formula 4}$$

By substituting Formulas 2 and 4 for Formula 3, Formula 5 is obtainable.

$$I3 = (½) \times \mu s \times Co \times (W3/L3) \times \{[((2 \times I2)/(\mu s \times Co)) \times (L2/W2)]^{1/2} + R \times I2\}^2 \quad \text{Formula 5}$$

Since I2=I1, a relationship between I3 and I2 is expressed by Formula 6.

$$I3 = (½) \times \mu s \times Co \times (W3/L3) \times \{[((2 \times I1)/(\mu s \times CO)) \times (L2/W2)]^{1/2} + R \times I1\}^2 \quad \text{Formula 6}$$

In the section of "R×I1" of Formula 6, by adjusting the value of resistor R which has a negative temperature coefficient, it is possible to compensate the current I1 having a positive temperature coefficient with the depletion-type MOS transistor Q1 illustrated in FIG. 1. By designating W/L and VGS of the MOS transistors Q12 and Q13 using W2/L2, W3/L3, VGS2, and VGS3, the current I1 having the positive temperature coefficient can be compensated by the depletion-type MOS transistor Q1 illustrated in FIG. 2.

Figure 4:
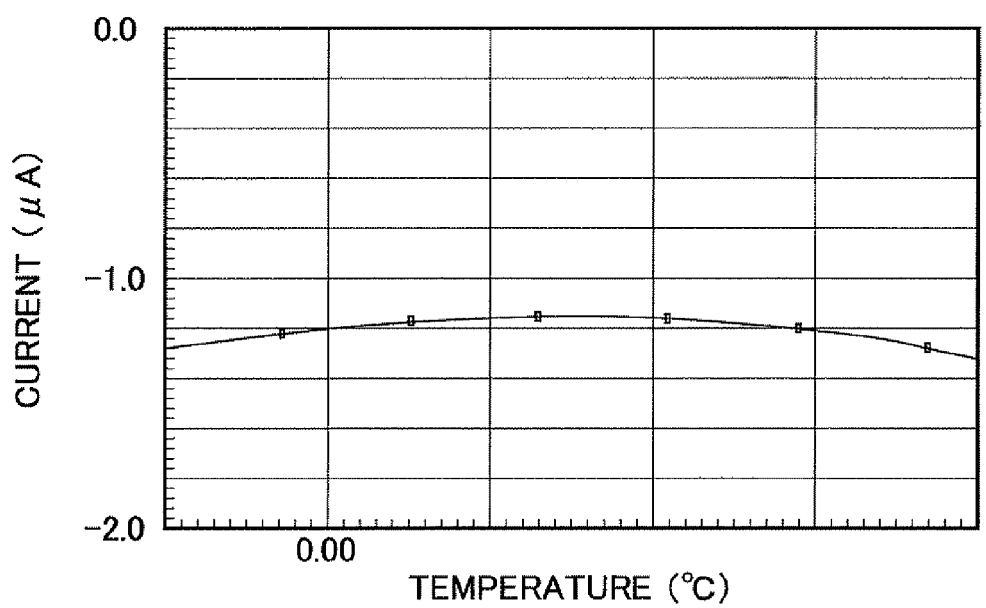
FIG. 4 illustrates a current-temperature property of Embodiment 1.

With this simple structure, it is possible to adjust the temperature property of the current source circuit, and the temperature property of the current source circuit can be substantially flattened as illustrated in FIG. 4.
<Modified Example of a Current Source Circuit>

Figure 5:
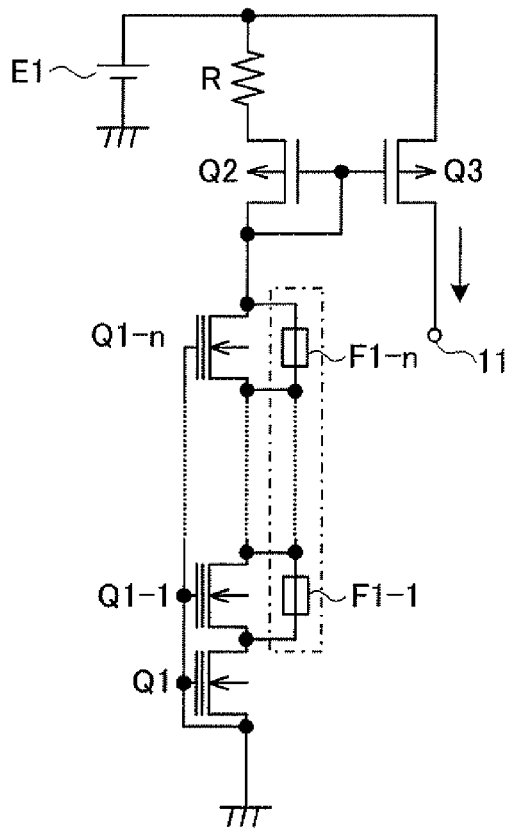
FIG. 5 is a circuit diagram of a first modified example of a current source circuit of Embodiment 1.

FIG. 5 is a circuit diagram of a first modified example of the current source circuit. This circuit is a modified example of the current source circuit of FIG. 1. The source of the MOS transistor Q1-1 among sequentially connected depletion-type N-channel MOS transistors Q1-1 to Q1-*n* is connected to the drain of a depletion-type N-channel MOS transistor Q1. The drain of the MOS transistor Q1-*n* is connected to the drain and gate of a MOS transistor Q2. The gates of the MOS transistors Q1-1 to Q1-*n* are mutually connected, and further connected to the gate of the MOS transistor Q1. The source and drain of each of the MOS transistors Q1-1 to Q1-*n* are connected by a corresponding one of fuses F1-1 to F1-*n*.

With this modified example, when any one of the fuses F1-1 to F1-*n* is irradiated by a laser to cut the any one of the fuses, the number of the MOS transistors Q1 connected in series to the MOS transistor Q1 increases to thereby enable adjusting the temperature coefficient in a positive direction.

Figure 6:
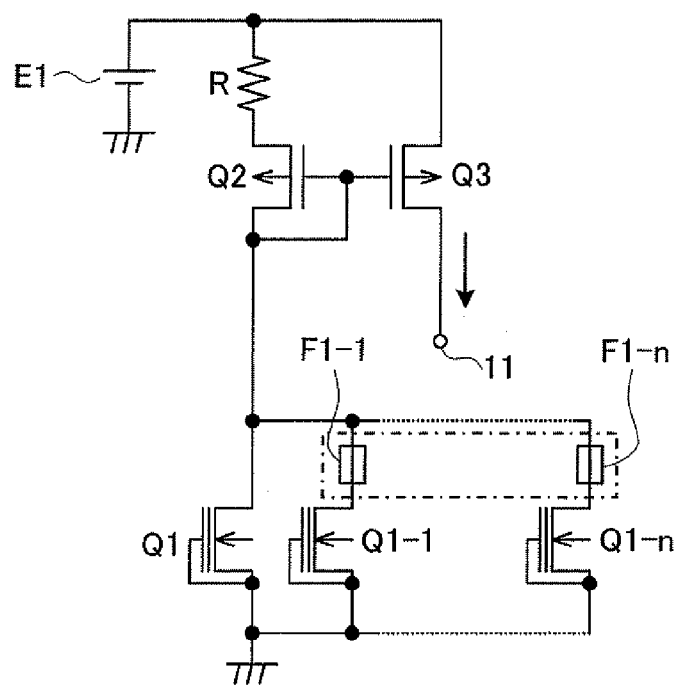
FIG. 6 is a circuit diagram of a second modified example of the current source circuit of Embodiment 1.

FIG. 6 is a circuit diagram of a second modified example of the current source circuit of Embodiment 1. This circuit is obtained by further modifying FIG. 1. The source of the depletion-type N-channel MOS transistor Q1 is connected to the sources of the depletion-type N-channel MOS transistors Q1-1 to Q1-*n*. First ends of the fuses F1-1 to F1-*n* are connected to the respective drains of the depletion-type N-channel MOS transistors Q1-1 to Q1-*n*, and the other ends of the fuses F1-1 to F1-*n* are mutually connected and further connected to the drain of the depletion-type N-channel MOS transistor Q1.

With the second modified example of Embodiment 1, when any one of the fuses F1-1 to F1-*n* is irradiated by a laser to cut the any one of the fuses, the number of the MOS transistors connected in parallel to the MOS transistor Q1 decreases to thereby enable adjusting the temperature coefficient in the negative direction.

Figure 7:
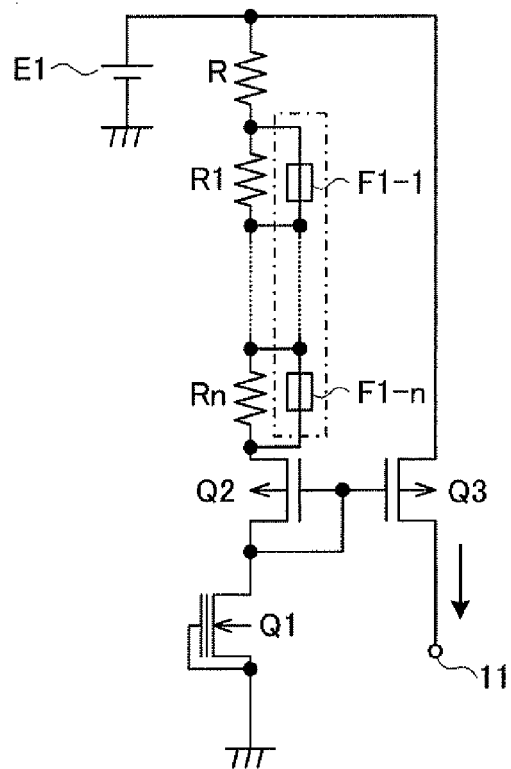
FIG. 7 is a circuit diagram of a third modified example of the current source circuit of Embodiment 1.

FIG. 7 is a circuit diagram of a third modified example of the current source circuit of Embodiment 1. The circuit is the modified example of FIG. 1, where polysilicon resistors R1 to Rn connected in series are inserted and connected between one end of the resistor R and the drain of the MOS transistor Q2. The ends of the resistor R1 to Rn are connected to ends of corresponding fuses F1-1 to F1-*n* one-on-one.

With the third modified example, when any one of the fuses F1-1 to F1-*n* is irradiated by a laser to cut the any one of the fuses F1-1 to F1-*n*, the number of the polysilicon resistors connected in series to the resistor R increases to thereby enable adjusting the temperature coefficient in the negative direction.

Figure 8:
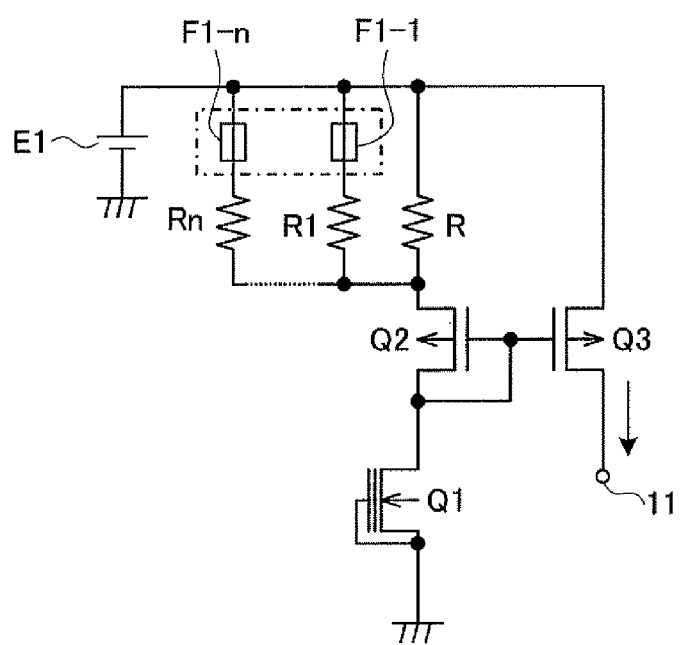
FIG. 8 is a circuit diagram of a fourth modified example of the current source circuit of Embodiment 1.

FIG. 8 is a circuit diagram of a fourth modified example of the current source circuit of Embodiment 1. The circuit is a modified example of FIG. 1, where first ends of the polysilicon resistors R1 to Rn are mutually connected and further connected to one end of the resistor R and the drain of the MOS transistor Q2. The other ends of the resistors R1 to Rn are connected to respective first ends of fuses F1-1 to F1-*n*. The other ends of the fuses F1-1 to F1-*n* are mutually connected and further connected to the other end of the resistor R and a direct current source E1.

With the fourth modified example, when any one of the fuses F1-1 to F1-*n* is irradiated by a laser to cut the any one of the fuses F1-1 to F1-*n*, the number of the polysilicon resistors connected parallel to the resistor R increases to thereby enable adjusting the temperature coefficient in the positive direction.

Figure 9:
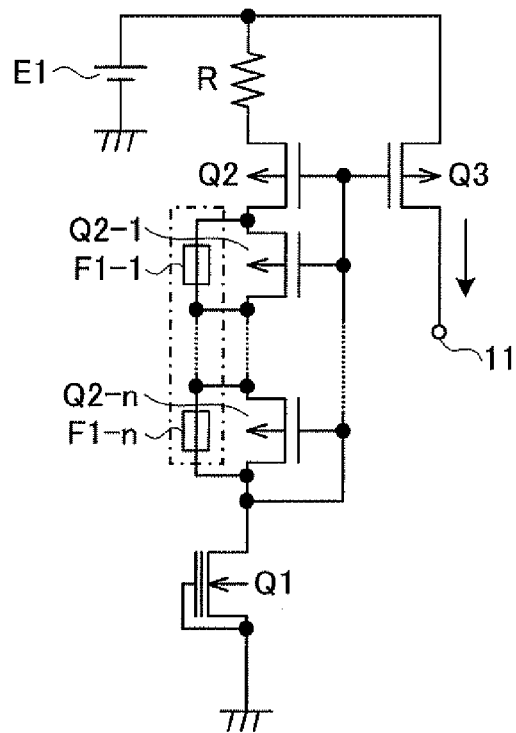
FIG. 9 is a circuit diagram of a fifth modified example of the current source circuit of Embodiment 1.

FIG. 9 is a circuit diagram of a fifth modified example of the current source circuit of Embodiment 1. This circuit is a modified example of the current source circuit of FIG. 1. The drain of the MOS transistor Q2-*n* among sequentially connected enhancement-type N-channel MOS transistors Q2-1 to Q2-*n* is connected to the drain of a depletion-type N-channel MOS transistor Q1. The source of the MOS transistor Q2-1 is connected to the drain of a MOS transistor Q2. The gates of the MOS transistors Q2-1 to Q2-*n* are mutually connected and further connected to the gate of the MOS transistor Q2. The gate of the MOS transistor Q2 is connected to the drain of the MOS transistor Q1. The sources and drains of the MOS transistors Q2-1 to Q2-*n* may be connected to corresponding fuses F1-1 to F1-*n* one-on-one.

Any one of the transistors Q2-1 to Q2-*n*, in which the corresponding fuse between the source and drain of the transistor is cut, makes a source current (a current flowing through the resistor R) of the MOS transistor Q2 forming a current mirror circuit increase. With the second modified example, when any one of the fuses F1-1 to F1-*n* is irradiated by a laser to cut the any one of the fuses, the number of the MOS transistors connected in parallel to the MOS transistor Q1 decreases to thereby enable adjusting the temperature coefficient in the negative direction.

Figure 10:
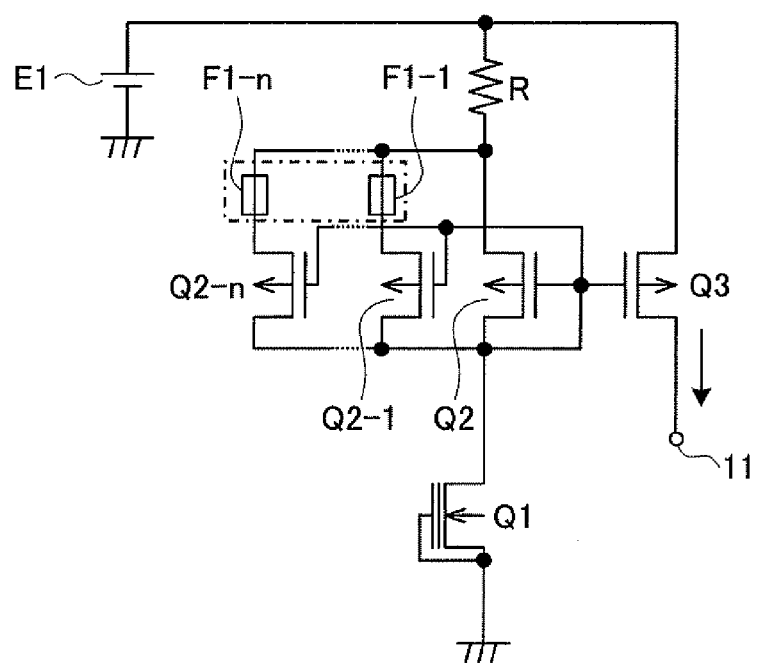
FIG. 10 is a circuit diagram of a sixth modified example of the current source circuit of Embodiment 1.

FIG. 10 is a circuit diagram of a sixth modified example of the current source circuit of Embodiment 1. This circuit is a modified example of FIG. 1. The drains of the enhancement-type P-channel MOS transistor Q2-1 to Q2-*n* are mutually connected and further connected to the drain of the MOS transistor Q2. First ends of the fuses F1-1 to F1-*n* are connected to corresponding sources of the MOS transistors Q2-1 to Q2-*n*. The other ends of the fuses F1-1 to F1-*n* are mutually connected. The gates of the MOS transistors Q2-1 to Q2-*n* are mutually connected, and further connected to the gate of the MOS transistor Q2.

When the fuse connected to any one of the MOS transistors Q2-1 to Q2-*n* is cut, a current flowing through the resistor R decreases. With the sixth modified example, when any one of the fuses F1-1 to F1-*n* is irradiated by a laser to cut the any one of the fuses, the source current of the MOS transistor Q2 is decreased to thereby enable adjusting the temperature coefficient in the positive direction.

Figure 11:
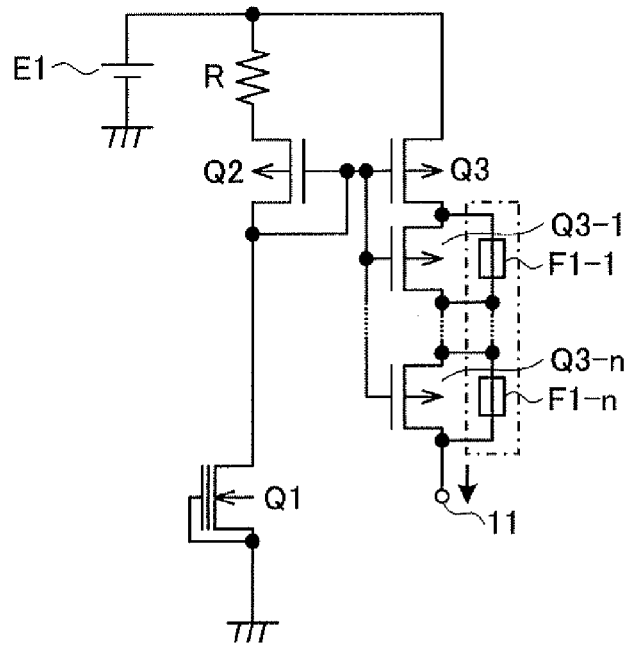
FIG. 11 is a circuit diagram of a seventh modified example of the current source circuit of Embodiment 1.

FIG. 11 is a circuit diagram of a seventh modified example of the current source circuit of Embodiment 1. This circuit is a modified example of the current source circuit of FIG. 1. The source of the MOS transistor Q3-1 among sequentially connected enhancement-type P-channel MOS transistors Q3-1 to Q3-*n* is connected to the drain of a MOS transistor Q3 forming a current mirror circuit. The drain of the MOS transistor Q3-*n* is connected to a terminal 11. The gates of the MOS transistors Q1-1 to Q1-*n* are mutually connected, and further connected to the gate of the MOS transistor Q3. The sources and drains of the MOS transistors Q3-1 to Q3-*n* are connected to corresponding fuses F1-1 to F1-*n*.

Any one of the transistor Q3-1 to Q3-*n*, in which the corresponding fuse between the source and drain of the transistor is cut, makes the source current of the MOS transistor Q3 forming the current mirror increase to thereby decrease a current flowing through a resistor R. With the seventh modified example, when any one of the fuses F1-1 to F1-*n* is irradiated by a laser to cut the any one of the fuses, the source current of the MOS transistor Q2 is decreased to thereby enable adjusting the temperature coefficient in the positive direction.

Figure 12:
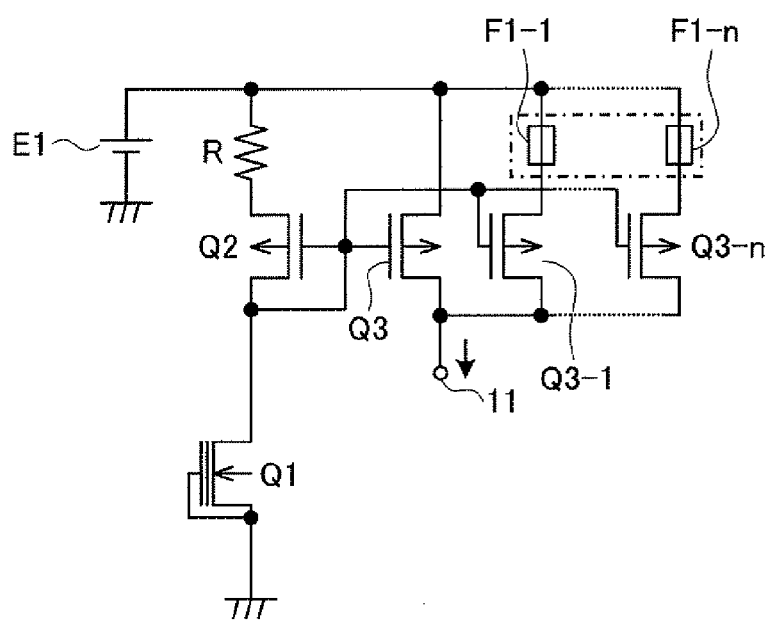
FIG. 12 is a circuit diagram of an eighth modified example of the current source circuit of Embodiment 1.

FIG. 12 is a circuit diagram of an eighth modified example of the current source circuit of Embodiment 1. This circuit is a modified example of FIG. 1. The drains of enhancement-type P-channel MOS transistor Q3-1 to Q3-*n* are mutually connected and further connected to the drain of a MOS transistor Q3. One end of each of the fuses F1-1 to F1-*n* is connected to the sources of the corresponding MOS transistors Q3-1 to Q3-*n*. The other ends of the fuses F1-1 to F1-*n* are mutually connected, and further connected to the source of the MOS transistor Q3. The gates of the MOS transistors Q3-1 to Q3-*n* are mutually connected, and further connected to the gate of the MOS transistor Q3.

When the fuse connected to anyone of the MOS transistors Q3-1 to Q3-*n* is cut, a current flowing through the resistor R is increased. With the eighth modified example, when any one of the fuses F1-1 to F1-*n* is irradiated by a laser to cut the any one of the fuses, the source current of the MOS transistor Q2 is increased to thereby enable adjusting the temperature coefficient in the negative direction.

Embodiment 2

<Application 1 of a Current Source Circuit>

Figure 13:
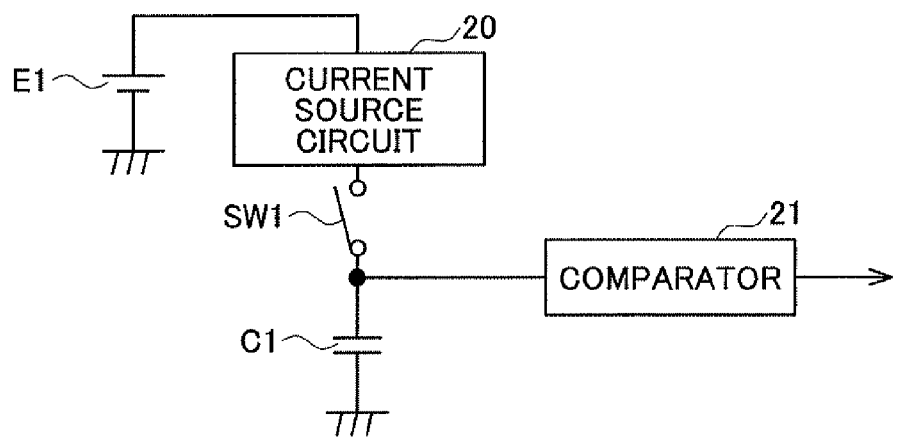
FIG. 13 is a delay circuit diagram including the current source circuit of Embodiment 2.

FIG. 13 is a delay circuit diagram of the current source circuit of Embodiment 2. Referring to FIG. 13, the current source circuit 20 is illustrated in, for example, FIG. 1. The terminal 11 of the current source circuit 20 is connected to one end of a capacitor C1 and one end of a comparator 21 via a switch SW1. The other end of the capacitor C1 is grounded. The comparator 21 outputs a high level signal when a charging voltage exceeds a threshold value in comparison with a predetermined threshold.

Figure 14:
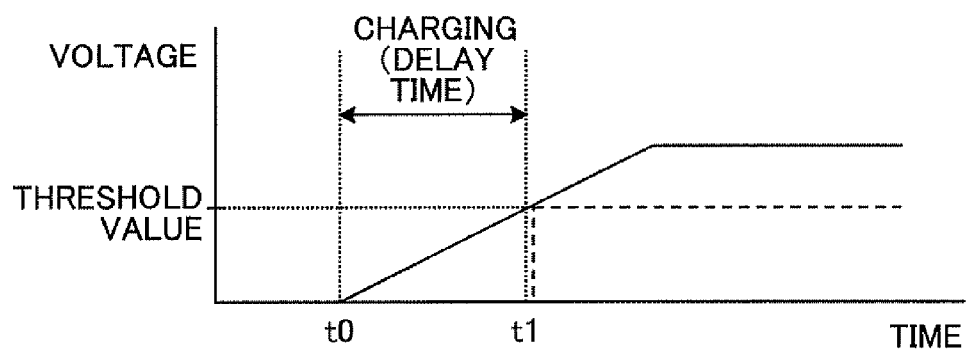
FIG. 14 is a flow diagram for explaining an operation of a delay circuit.

By turning on the switch SW1 at a time t0, the charging voltage of the capacitor C1 increases as indicated by a solid line in FIG. 14, and when the charging voltage exceeds a threshold at a time t1, the output from the comparator 21 becomes a high level as illustrated in a broken line in FIG. 14. By adjusting a temperature property of an output current from the current source circuit 20 so as to be flattened, it is possible to stabilize a delay time between the time t0 and a time t1 so as to be constant irrespective of the temperature.

Figure 15:
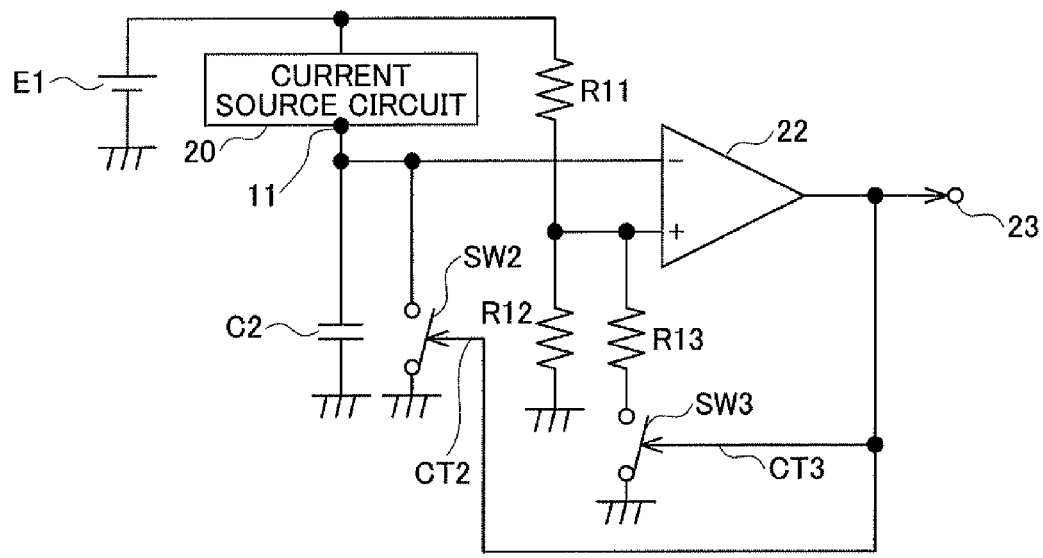
FIG. 15 illustrates a structure of an oscillating circuit in which the current source circuit is installed of Embodiment 2.

FIG. 15 is a delay circuit diagram of the oscillating circuit of Embodiment 2 to which the current source circuit is applied. Referring to FIG. 15, the current source circuit 20 is illustrated in, for example, FIG. 1. The terminal 11 of the current source circuit 20 is connected to one end of a capacitor C2, one end of a switch SW2, and an inverting input terminal of a comparator 22. The other end of the capacitor C2 and the other end of the switch SW2 are grounded.

One end of the resistor R11 is connected to a positive electrode of a direct-current power source E1. The other end of the resistor R11 is connected to ground via a resistor R12, and further grounded via a resistor R13 and a switch SW3 which are connected in series, and further connected to a noninverting input terminal of the comparator 22. An output signal of the comparator 22 is output from a terminal 23 and simultaneously supplied to control terminals of switches SW2 and SW3. The switches SW2 and SW3 are turned on when a high level signal is supplied to the control terminals and turned off when a low level signal is supplied to the control terminals CT2 and CT3.

Figure 16:
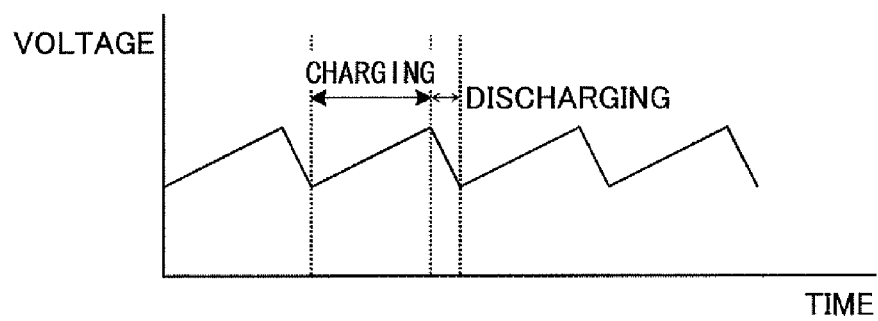
FIG. 16 is a waveform chart for explaining an operation of the oscillating circuit.

When the output from the comparator 22 is in a low level, a threshold of the comparator 22 is increased to be a first threshold because the switch SW3 is turned off, the capacitor C2 is charged by the output current from the current source circuit 20 of the capacitor C2, and increases as illustrated in FIG. 16.

When the charging voltage of the capacitor C2 exceeds the first threshold, the output of the comparator 22 becomes a high level. Then, the threshold of the comparator 22 decreases to be a second threshold when the switch SW3 is turned on. Simultaneously, the capacitor C2 is discharged and the voltage of the capacitor C2 is decreased as illustrated in FIG. 16. When the voltage of the capacitor C2 becomes the second threshold or less, the output current from the comparator 22 becomes a low level.

By repeating the above operations, a rectangular waveform with a predetermined period is output from the terminal 23. By adjusting the temperature property of the output current from the current source circuit 20 to be flat, it is possible to stabilize the period of the rectangular wave so as to be constant.

Embodiment 3

Figure 17:
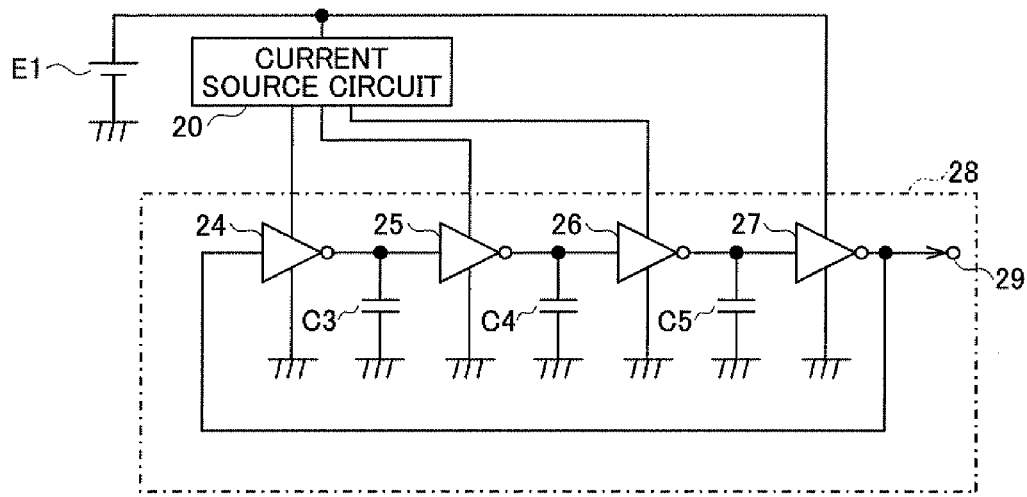
FIG. 17 illustrates a structure of a ring oscillator in which a current source circuit is installed of Embodiment 3.
Figure 18:
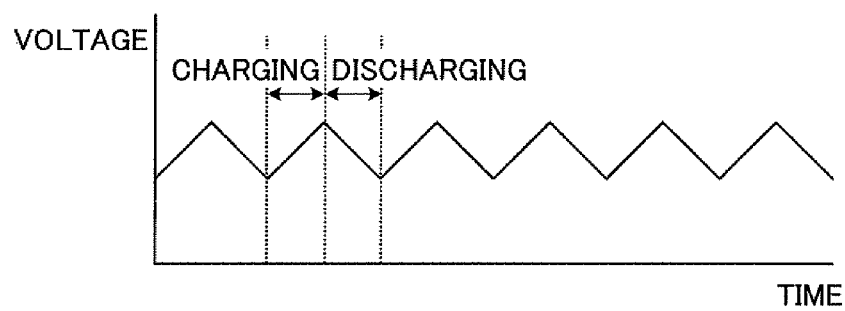
FIG. 18 is a flow diagram for explaining an operation of the ring oscillator.

FIG. 17 illustrates a structure of an oscillating circuit to which a current source circuit of Embodiment 3 is applied. Referring to FIG. 17, the current source circuit 20 is illustrated in, for example, FIG. 1. Inverters 24, 25, and 26 and an output inverter 27 are connected like a ring. First ends of the capacitors C3, C4, and C5 are connected to corresponding inverters 24, 25, and 26. The other ends of the capacitors C3, C4, and C5 are grounded. Thus, a ring oscillator 28 is formed. The current source circuit 20 supplies charging currents, i.e. operation currents, for the capacitors C3, C4, and C5 to the inverters 24, 25, and 25. The output inverter 27 is directly supplied with an operation current from the direct-current power source E1.

For example, the capacitor C5 is charged by a current from the current source circuit 20 when the high level signal is output from the inverter 26. Meanwhile, the capacitor C5 is discharged when the low level signal is output from the inverter 26. The voltage of the capacitor C5 becomes like a voltage waveform illustrated in FIG. 18. With this, a rectangular waveform with a predetermined period is output from an output terminal of the ring oscillator 28, namely an output terminal of the inverter 27. By adjusting the temperature property of the output current from the current source circuit 20 to be flat, it is possible to stabilize the period of the rectangular wave so as to be constant.

Embodiment 4

<Application 2 of the Current Source Circuit>

Figure 19:
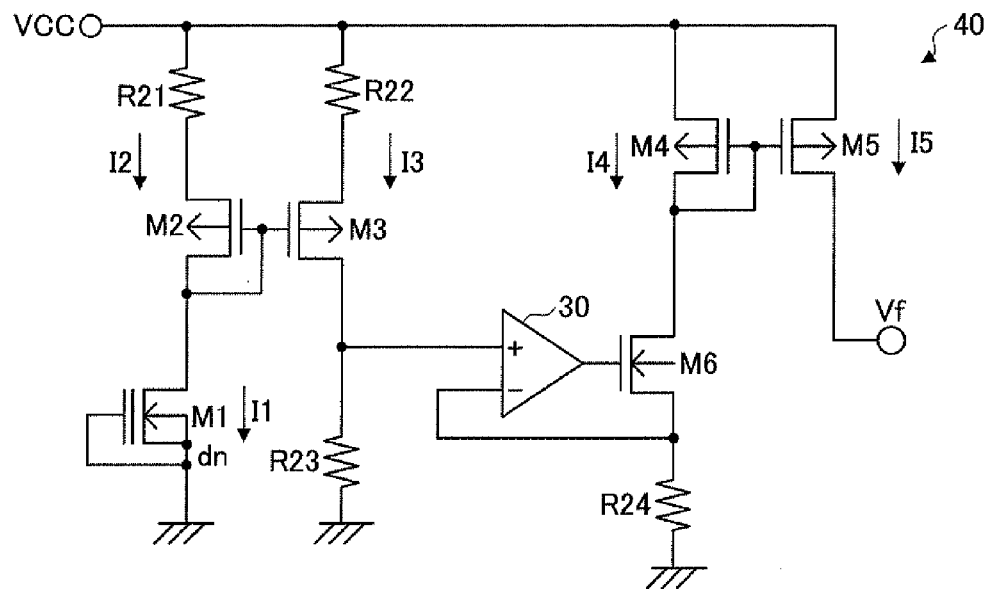
FIG. 19 is a circuit diagram illustrating an embodiment of a current source circuit different from FIG. 1 to FIG. 12 of Embodiment 4.

FIG. 19 is a circuit diagram illustrating Embodiment 4 of a current source circuit different from FIG. 1 to FIG. 12 of Embodiments 1-3. Referring to FIG. 19, the current source circuit illustrated in FIG. 1 is further modified to enable adjusting the frequency of an oscillator or the like.

Referring to FIG. 19, the current source circuit 40 of Embodiment 4 includes a depletion-type N-channel MOS transistor M1, P-channel MOS transistors M2 and M3, resistors R21, R22, and R23, an operational amplifier 30, a N-channel MOS transistor M6, P-channel MOS transistors M4 and M5, and a resistor R24.

Referring to FIG. 19, the depletion-type N-channel MOS transistor M1 corresponds to a depletion-type N-channel transistor Q1 of the current source circuit illustrated in FIG. 1. The P-channel MOS transistor M2 and M3 correspond to P-channel MOS transistor Q2 and Q3 of the current source circuit illustrated in FIG. 1, respectively. The P-channel MOS transistors M2 and M3 form a current mirror circuit. The resistor R21 corresponds to the resistor R of the current source circuit illustrated in FIG. 1. In a similar manner to FIG. 1, the source and gate of the depletion-type N-channel MOS transistor M1 are connected, the drain of the depletion-type N-channel MOS transistor M1 is connected to the drain and gate of the P-channel MOS transistor 2 and also to the gate of the P-channel MOS transistor M3 in common. The source of the P-channel MOS transistor M2 is connected to a power supply line VCC via the resistor R21.

The source of the P-channel MOS transistor M3 is connected to the power supply line VCC via the resistor R22. Therefore, the circuit structure is different from that illustrated in FIG. 1 at a point that the source of the P-channel MOS transistor Q3 is directly connected to the positive electrode of the power source E1 in FIG. 1. The drain of the P-channel MOS transistor M3 is grounded via the resistor R23, and different from the current source circuit illustrated in FIG. 1 at a point that the drain of the P-channel MOS transistor M3 is the output terminal 11 in FIG. 1.

A structure newly added to the current source circuit 40 related to FIG. 19 is a connection of the drain of the P-channel MOS transistor M3 to a noninverting input terminal of the operational amplifier 30. The source of the P-channel MOS transistor M3 is connected to the inverting input terminal of the operational amplifier 30. The source of the P-channel MOS transistor M3 and the inverting input terminal of the operational amplifier 30 are grounded via the resistor R24. The output terminal of the operational amplifier 30 is connected to the gate of the N-channel MOS transistor M6. The source of the N-channel MOS transistor M6 is connected to the inverting input terminal of the operational amplifier 30, and the source of the N-channel MOS transistor M6 and the noninverting input terminal of the operational amplifier 30 are grounded via the resistor R24. The drain of the N-channel MOS transistor M6 is connected to the drain and gate of the P-channel MOS transistor 4 and the gate of the P-channel MOS transistor M5 in common. The sources of the P-channel MOS transistors M4 and M5 are connected to the power supply line VCC and form a current mirror circuit. The drain of the P-channel MOS transistor M5 is connected to the output terminal Vf illustrated in FIG. 19.

In the current source circuit 40 having the structure, the depletion-type N-channel MOS transistor M1 has a positive temperature property (positive temperature coefficient), the resistor R21 has a negative temperature property, and the resistor R22 has a positive temperature property. Accordingly, the temperature property is flat, and a current I3 which is not affected by the temperature property is generated.

The operational amplifier 30 amplifies the current I3 flowing through the resistor R22 and supplies the amplified current I3 to the gate of the N-channel MOS transistor M6. The resistors R23 and R24 are polysilicon resistors of the same type and configured to have a similar temperature property. With this, even if the temperature changes, the temperature properties of the resistors R23 and R24 are similar. Therefore, a voltage input to the noninverting input terminal of the operational amplifier 30 and a voltage input in the inverting input terminal have similar temperature properties, and a constant current may be output.

The resistor R22 is provided to further minutely adjust the current temperature property which is basically corrected by the resistor R and (W/L) as illustrated in FIG. 1. Hereinafter, the correction of the current/temperature property using the resistor R22 is described.

Referring to FIG. 19, when the gate-source voltages of the MOS transistors M2 and M3 are designated by VGS2 and VGS3, and drain currents flowing through the MOS transistors M2 and M3 are designated by I2 and I3, Formula 7 can be established since the gates are connected in common to have a common voltage.

$$VGS2 + R21 \times I2 = VGS3 + R22 \times I3 \qquad \text{Formula 7}$$

When Formula 7 is transformed, Formula 8 is obtainable.

$$I3 = (VGS2 - VGS3 + R21 \times I2)/R22 \qquad \text{Formula 8}$$

Reference symbols of Formulas 9 and 10 are similar to those in the Formulas 2 and 3. A reference symbol μs designates a surface mobility, a reference symbol Co designates a gate capacity per a unit area, a reference symbol W/L designates a MOS gate size, a reference symbol VGS designates a gate-source voltage, and a reference symbol VT designates a threshold voltage.

$$VGS2 = \{(2 \times I2)/(\mu s \times Co)/(W2/L2)\}^{-1/2} + VT \qquad \text{Formula 9}$$

$$VGS3 = \{(2 \times I3)/(\mu s \times Co)/(W3/L3)\}^{-1/2} + VT \qquad \text{Formula 10}$$

Based on Formulas 8, 9, and 10, the basic current temperature property is corrected using (W/L) and R21. The current I3 may be minutely adjusted by multiplying (1/the resistance value of R22).

Current I3 is generated by the minute adjustment described above. Thus, a current I5 having a stable current-temperature property (e.g. a flat graph line of the current I5 relative to the temperature) is obtainable.

The resistance values of the resistors R22, R23, and R24 can be easily and accurately adjusted by trimming using, for example, a laser beam.

Embodiment 5

The current source circuit 40 illustrated in FIG. 19 may be used as a current source for the oscillating circuit. Embodiment 5 in which the current source circuit is used as the current source of the oscillating circuit is described next.

Figure 20:
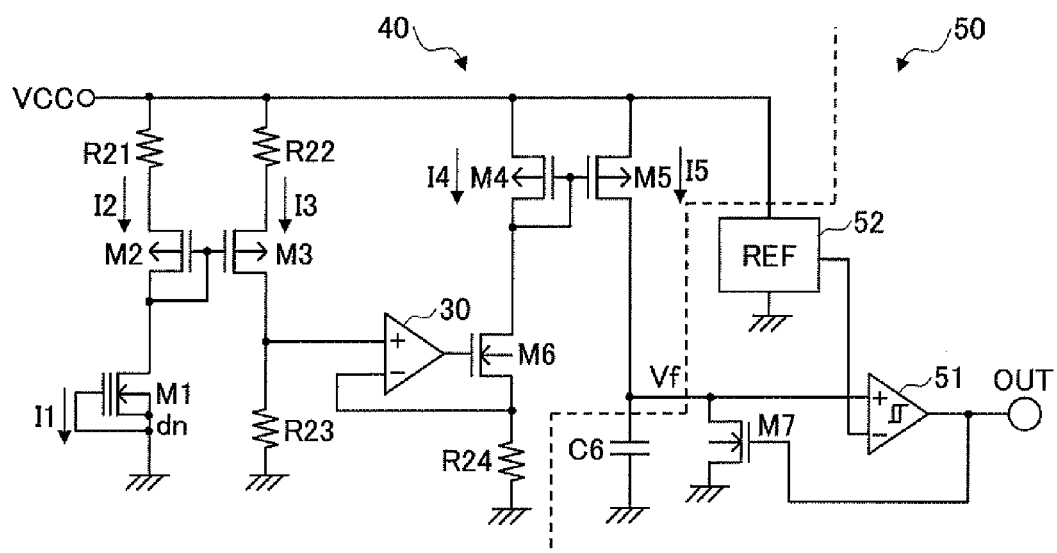
FIG. 20 is a circuit diagram illustrating an example of an oscillating circuit of Embodiment 5.

FIG. 20 is a circuit diagram illustrating an example of an oscillating circuit 50 of Embodiment 5. The oscillating circuit 50 includes a capacitor C6, a N-channel MOS transistor M7, a comparator 51, a reference voltage generating unit 52, and a terminal OUT, in addition to the current source circuit 40.

The output of the current source circuit 40 is a connection point Vf. The connection point Vf is connected through the capacitor C6. The connection point Vf is grounded to the noninverting input terminal of the comparator 51 and the drain of the N-channel MOS transistor M7. The reference voltage generating unit 52 is connected to the power supply line VCC, grounded, and connected to the inverting input terminal of the comparator 51. The reference voltage generating unit 52 supplies a reference voltage to the inverting input terminal of the comparator 51. The output terminal of the comparator 51 is connected to the terminal OUT and the gate of the N-channel MOS transistor M7. The drain of the N-channel MOS transistor M7 is connected to the noninverting input terminal of the comparator 51, and the source of the N-channel MOS transistor M7 is grounded.

With the oscillating circuit of Embodiment 5, the current source circuit 40 which outputs the current I5 to the connection point Vf has a structure similar to that described in FIG. 19. Therefore, the current source circuit 40 satisfies Formulas 8, 9 and 10, and the current-temperature property can be minutely adjusted with the resistor R22.

Figures 21A, 21B:
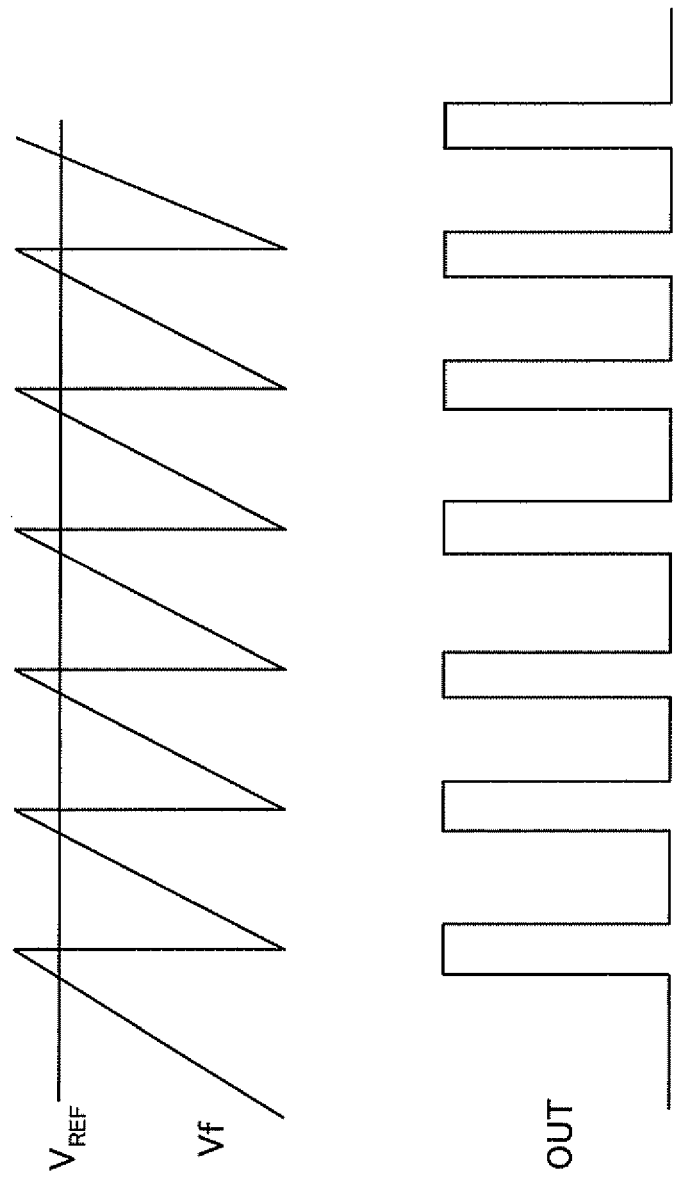
FIG. 21A and FIG. 21B illustrate voltage waveforms at a connection point Vf and an output terminal OUT in FIG. 20.

FIG. 21A and FIG. 21B illustrate voltage waveforms at the connection point Vf and the output terminal OUT of FIG. 20. FIG. 21A illustrates a voltage waveform in the connection point Vf, and FIG. 21E illustrates a voltage waveform in the output terminal OUT.

As illustrated in FIG. 20, the current I5 flows into the capacitor C6 as a charging current. Because the charging current has a predetermined value, an electric charge is accumulated in the capacitor C6 in proportion to time. As illustrated in FIG. 21A, the voltage in the connection point Vf increases in proportion to the time. When the voltage of the connection point Vf becomes more than a reference voltage VREF output from a reference voltage generating unit 52, the comparator 51 outputs a high level voltage. Therefore, the high level voltage is applied to the N-channel MOS transistor M7 and the N-channel MOS transistor M7 is turned on. Then the electric charges accumulated in the capacitor becomes zero, and the voltage of the connection point Vf becomes zero.

At this time, as illustrated in FIG. 21B, a pulsed voltage having a predetermined frequency is output from the terminal OUT with a predetermined delay of time after the voltage of the connection point Vf exceeds the reference voltage VREF. Thus, oscillation occurs.

When a reference symbol I designates a charging current flowing through the capacitor C6, a reference symbol C designates a capacitance C of the capacitor C6, and a reference symbol V designates a reference voltage VREF, an oscillating frequency can be expressed by Formula 11.

$$f = I/CV \qquad \text{Formula 11}$$

With Formula 11, in order to make the oscillating frequency highly accurate, the charging current I and the reference voltage V may be set to be highly accurate. The oscillating frequency f changes along with the magnitude of the charging current I. Therefore, in order to acquire a desirable frequency, it is preferable to adjust the charging current I.

Figure 22:
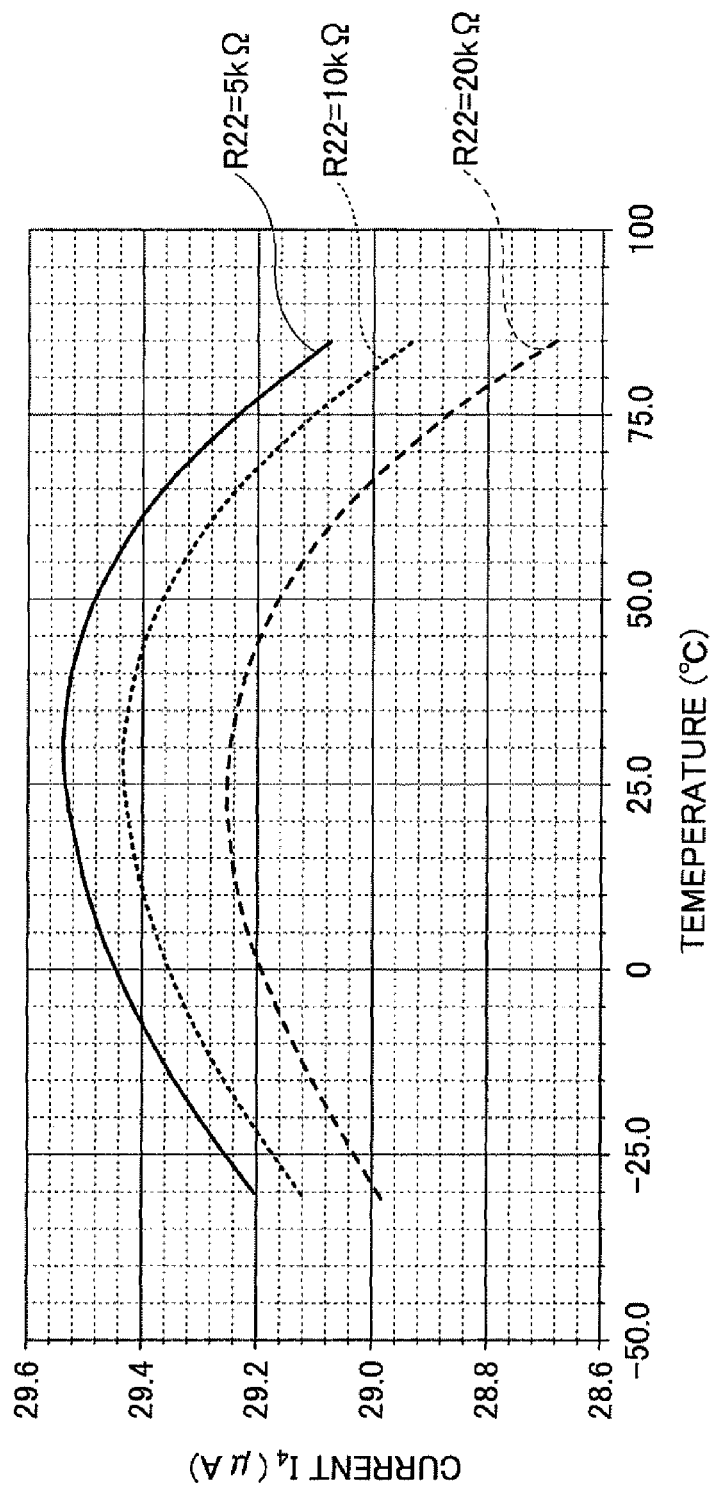
FIG. 22 illustrates a temperature property of a current $I_4$ in the oscillating circuit illustrated in FIG. 20.

FIG. 22 is a chart illustrating a temperature property of a current I4 flowing through the resistor R24 illustrated in FIG. 20. Referring to FIG. 22, the axis of abscissa designates a temperature [° C.] and the axis of ordinate designates the current I4 [μA]. As illustrated in FIG. 22, by changing the resistance value of the resistor to 5 kΩ, 10 kΩ, and 20 kΩ in this order, the temperature property of the current flowing through the resistor R24 minutely changes in units of 0.1 μA. By changing the resistor value of the resistor R22, it is possible to adjust the value of the current I4 in the order of 0.1 μA. Since the relationship I4≈I5 is established by the current mirror circuit, it is possible to change the charging current flowing into the capacitor C6.

Figure 23:
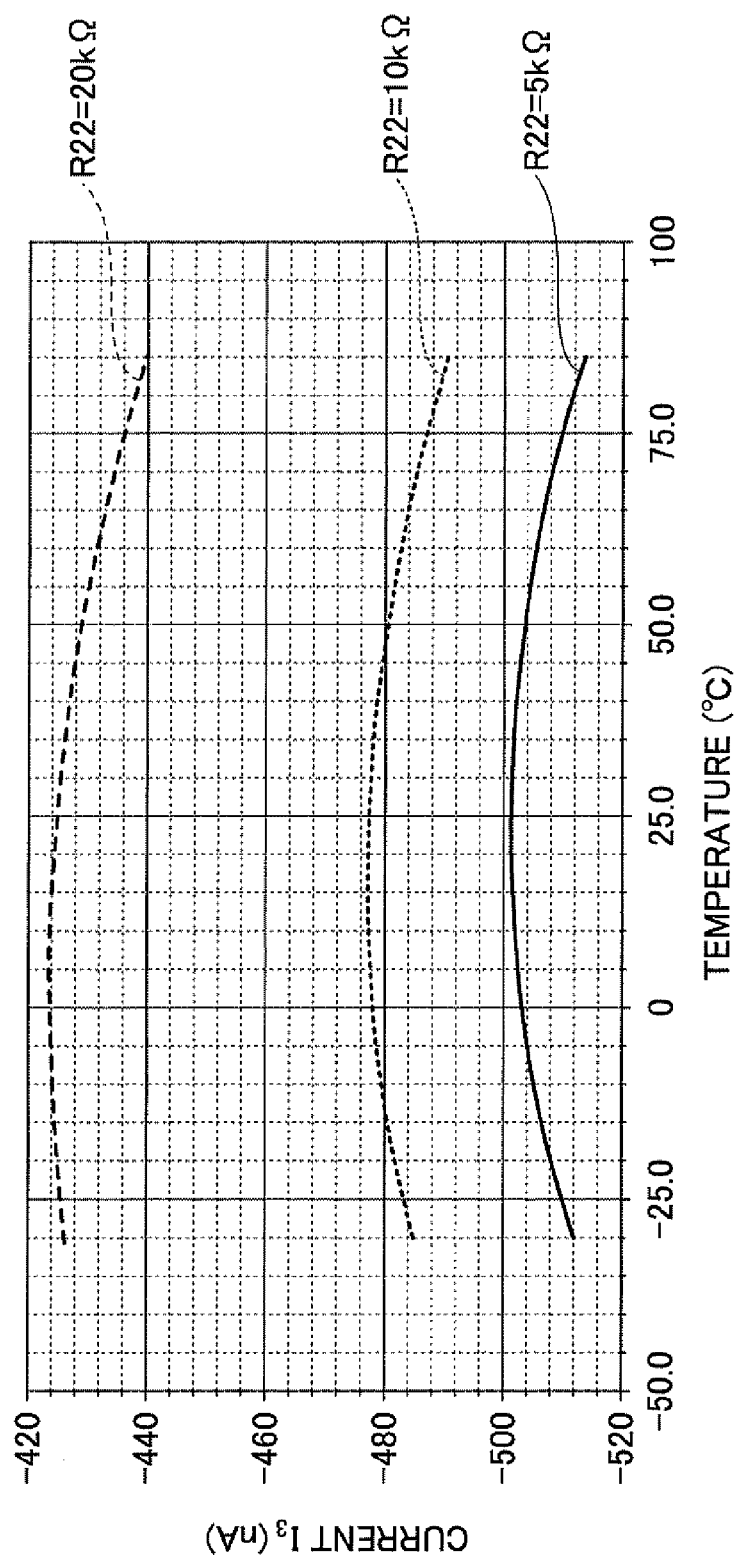
FIG. 23 illustrates an example temperature property of the current $I_3$.

FIG. 23 illustrates an example temperature property of the current I3. Referring to FIG. 23, the axis of abscissa designates the temperature [° C.] and the axis of ordinate designates the current I3 [nA]. The order level of the current I3 is smaller than that in FIG. 22.

Referring to FIG. 23, by changing the resistance value of the resistor R22 to 5 kΩ, 10 kΩ, and 20 kΩ in this order, the current I3 changes substantially in the order of 10 nA. In the current source circuit used in the oscillating circuit illustrated in FIG. 20, the resistance value of the resistor R22 is adjusted. Then, the current I3 flowing through the P-channel MOS transistor M3 and output from the current source circuit on the first stage can be minutely adjusted substantially in the order of 10 nA. Then, the current I3 is amplified by the operational amplifier 30. The current I4 flowing through the resistor R24 is adjusted substantially in the order of 0.1 μA (=100 nA). Therefore, the current I4 can be adjusted in a substantially similar order level to that of the charging current I supplied to the capacitor C6 of the oscillating circuit 50.

The adjustment of the resistance value of the resistor R22 can be easily carried out by trimming the fuse illustrated in FIG. 7 and FIG. 8 thereby easily outputting a highly accurate current.

As described, in the oscillating circuit 50 of Embodiment 5, the current source circuit 40 has a two stage structure. The resistor R23 in the first stage and the resistor R24 in the second stage have similar current-temperature properties. Between the source of the P-channel MOS transistor M3 of the current mirror circuit of the first stage and a power supply line VCC, the resistor R22 is provided to minutely adjust the output current I3 of the first stage. Thus, the output current I3 of the first stage is amplified in connection with the resistor R22. Thus, the charging current I for the capacitor C6 equivalent to I5 for determining the oscillating frequency of the oscillating circuit 50 is changed to thereby acquire an oscillating output at a desirable oscillating frequency.

A measure for amplifying the output current I3 of the current source circuit of the first stage of the current source circuit is the operational amplifier 30 in FIG. 19 and FIG. 20. However, any measure which can amplify the current is applicable.

Figure 24:
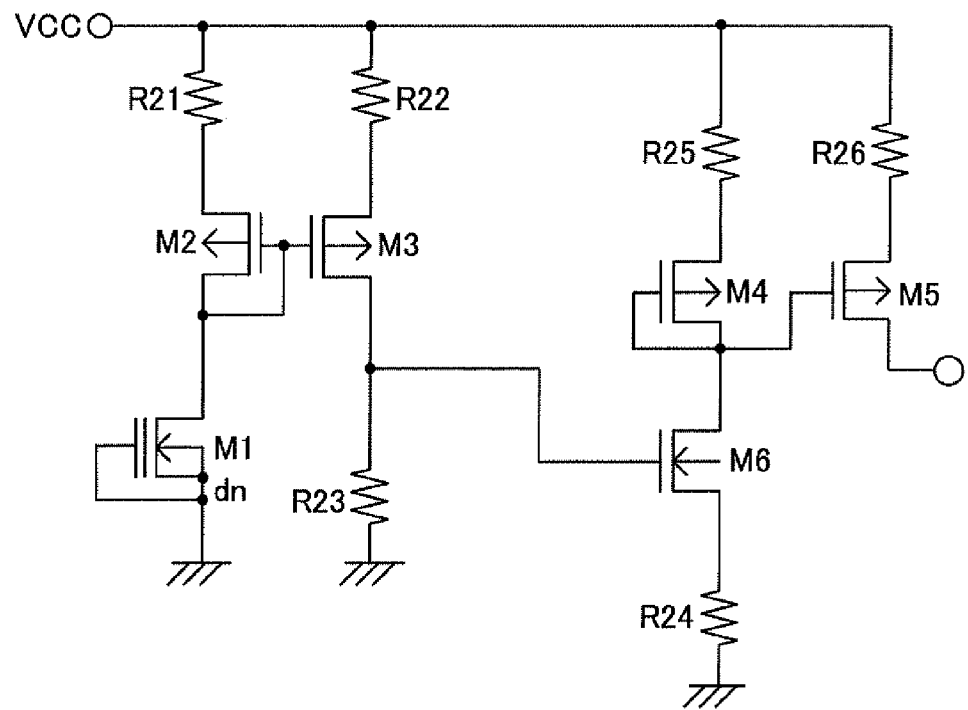
FIG. 24 is a circuit diagram illustrating a first example of the current source circuit 40 of Embodiment 5.

FIG. 24 is a circuit diagram illustrating a first modified example of the current source circuit 40 of Embodiment 5. In the current source circuit of a first modified example, the operational amplifier 30 is removed from the current source circuit 40 illustrated in FIG. 20. The first modified example has a structure in which the drain of the P-channel MOS transistor M3 is directly connected to the gate of the N-channel MOS transistor M6. The current source circuit 40 is structured so that signs of the current-temperature property in the resistors R23 and R24 are inverted along with the removal of the operational amplifier 30 in which the signs are inverted from the current source circuit 40 illustrated in FIG. 20. When the resistor R23 has a certain positive current-temperature property, the current source circuit is structured to have a negative temperature property which is symmetric to the positive current-temperature property to cancel out the positive current-temperature property. With this, it is possible to realize a current source having a stable current-temperature property (e.g. a flat graph line of the current I5 relative to the temperature) without using the operational amplifier. The other structural elements are similar to the current source circuit 40 related to FIG. 20. Therefore, the same reference symbols are attached to the other structural elements and descriptions of those are omitted.

As described, the output current I3 of the first stage of the current source circuit 40 may be directly input in the second stage of the current source circuit 40 to turn on the N-channel MOS transistor M6. According to the current source circuit of Embodiment 5, it is possible to realize the stable current-temperature property (e.g. a flat graph line of the current relative to the temperature) with a small number of components and the output current value can be adjusted.

Figure 25:
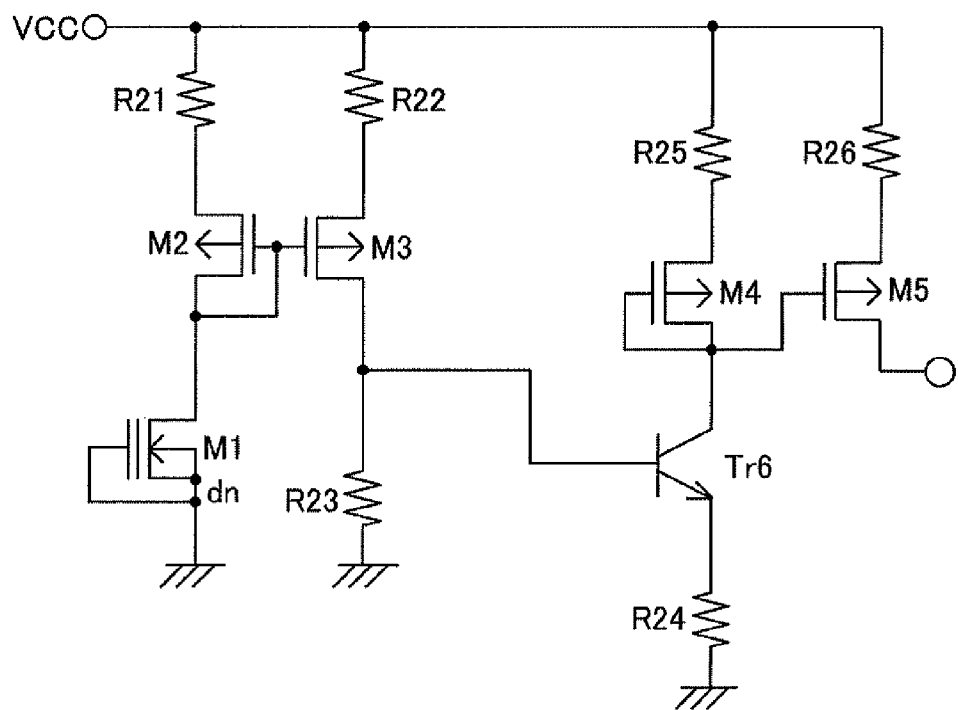
FIG. 25 is a second modified example of the current source circuit 40 of Embodiment 5.
Figure 26A:
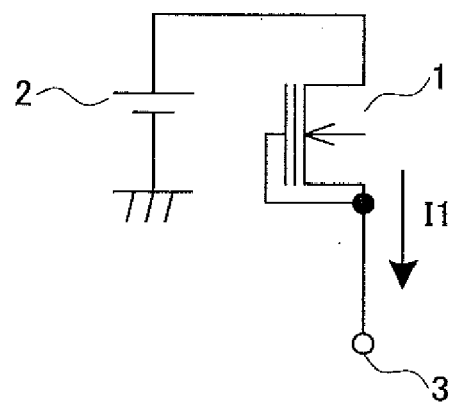
FIG. 26A illustrates an example current source circuit using an example depletion-type metal oxide semiconductor.
Figure 26B:
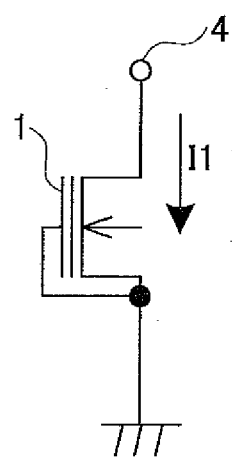
FIG. 26B illustrates another example current source circuit using another example depletion-type metal oxide semiconductor.
Figure 27:
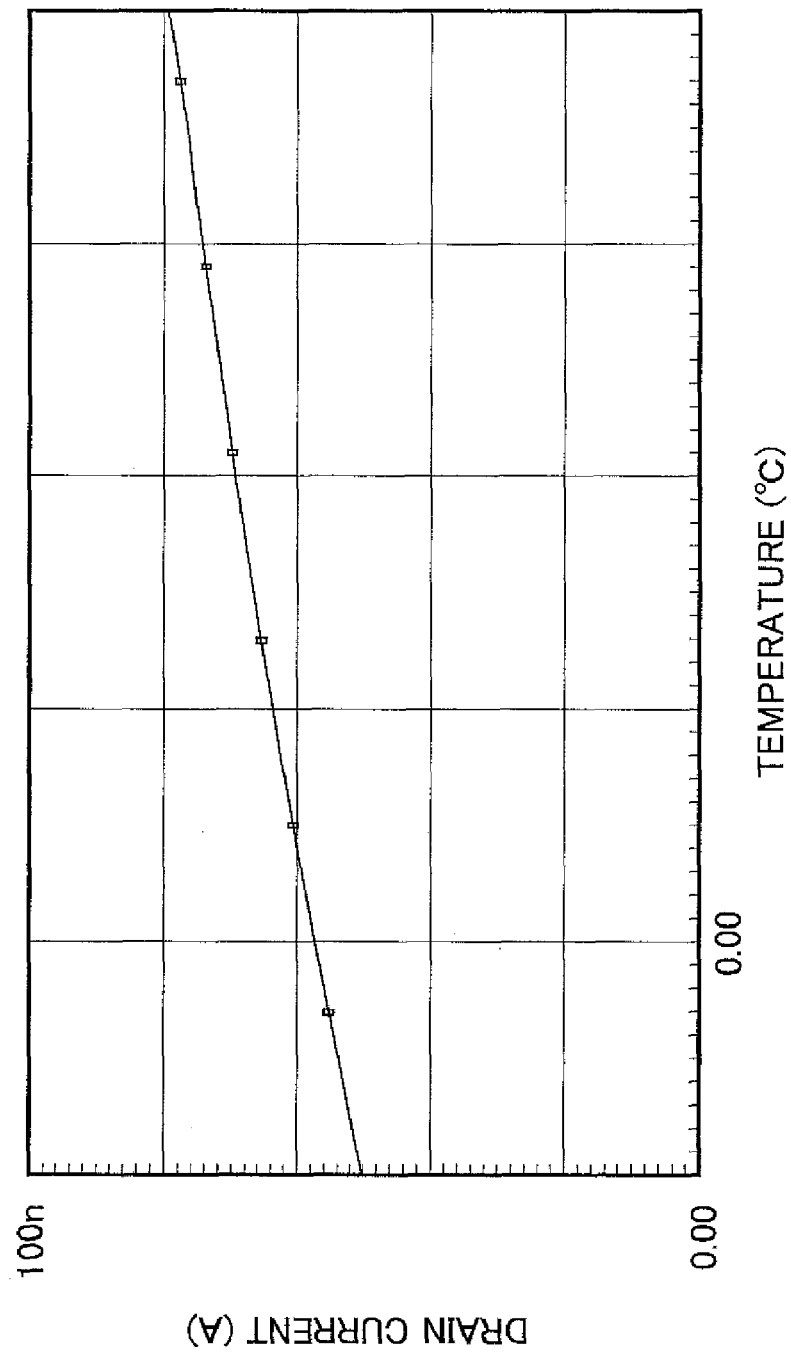
FIG. 27 illustrates a drain current-temperature property of the depletion-type MOS transistor.

FIG. 25 is a circuit diagram illustrating a second modified example of the current source circuit 40 of Embodiment 5. In the second modified example of Embodiment 5, the N-channel MOS transistor M6 of the current source circuit 40 of the first modified example of Embodiment 5 is replaced by a bipolar transistor Tr6.

As described, the input to the current source circuit 40 of the second stage may be by the bipolar transistor Tr6. The bipolar transistor Tr6 is an NPN-type transistor in FIG. 25. The drain of the P-channel MOS transistor M3 is connected to the base of the bipolar transistor Tr6. The collector of the bipolar transistor Tr6 is connected to the gate and a drain of the P-channel MOS transistor M4 and the gate of the P-channel MOS transistor M5 in common. The emitter of the bipolar transistor Tr6 is grounded via a resistor R24. According to the structure, current-temperature properties of the resistors R23 and R24 are inverted as in the current source circuit illustrated in FIG. 24. The other structural elements are similar to those of the current source circuit 40 illustrated in FIG. 29 and those of the current source circuit of the first modified example illustrated in FIG. 24 and the same reference symbols as those are attached, and descriptions of those are omitted.

In the current source circuit of the second modified example of Embodiment 5, in a similar manner to the current source circuit of the first modified example, the stable current-temperature property (e.g. a flat graph line of the current relative to the temperature) is realized and the output current value can be adjusted with a small number of components.

Examples and modified examples of the embodiments described above can be mutually combined as long as contradictions are not caused. For example, it is possible to use the current source circuit 40 illustrated in FIG. 20 and the current source circuits of the first and second modified examples are applicable to the delay circuit illustrated in FIG. 13 and FIG. 14, and the oscillating circuit illustrated in FIG. 15 to FIG. 18. The current source circuit illustrated in FIG. 1 to FIG. 12 is applicable to the oscillating circuit 50 illustrated in FIG. 20.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:
1. A current source circuit comprising:
   a current mirror circuit having two enhancement-type MOS transistors;
   a depletion-type MOS transistor configured to be connected to a drain of one of the two enhancement-type MOS transistors, to connect a source of the depletion-type MOS transistor to a gate of the depletion-type MOS transistor, and to function as a constant current source; and a resistor configured to have a negative temperature property and be connected to a source of the one of the two enhancement-type MOS transistors.

2. The current source circuit according to claim 1, wherein the resistor is made of polysilicon.

3. The current source circuit according to claim 2, further comprising:
   an adjusting circuit including:
   a plurality of MOS transistors connected to the one of the enhancement-type MOS transistors in series or in parallel or a plurality of resistors connected to the resistor having the negative temperature property; and
   a plurality of fuses connected to the plurality of MOS transistors or the plurality of resistors one-on-one.

4. The current source circuit according to claim 1,
   wherein the two enhancement-type MOS transistors are attributed to a P-channel type,
   the resistor is interposed between the source of the one of the two enhancement-type MOS transistors and a power supply line,
   the depletion-type MOS transistor is attributed to a N-channel type and a drain of the depletion-type MOS transistor is connected to the drain of the one of the two enhancement-type MOS transistors, and the source of the depletion-type MOS transistor is grounded, and
   a current is output from a drain of another one of the two enhancement-type MOS transistors.

5. A current source circuit comprising:
   the current source circuit according to claim 4;
   a second resistor having a positive temperature coefficient configured to be interposed between the source of the other one of the two enhancement-type MOS transistors and the power supply line;
   a second current mirror circuit including two P-channel MOS transistors configured to be provided separate from the current source circuit according to claim 4;
   a constant current circuit interposed between an output of the current source circuit and a drain of one of the two P-channel MOS transistor, the constant current circuit including
   a third resistor connected to the drain of the one of the two enhancement-type MOS transistors;
   a fourth resistor made of a material of a similar kind to a material of the third resistor and connected to a drain of the one of the two P-channel MOS transistors via a driving transistor configured to drive the second current mirror circuit and to determine an input current to the second current mirror circuit; and
   an operational amplifier interposed between the drain of the one of the two enhancement-type MOS transistors and a gate of the driving transistor,
   wherein the drain of the one of the two enhancement-type MOS transistors is connected to a noninverting input terminal of the operational amplifier, the gate of the driving transistor is connected to an output terminal of the amplifier, and a source of the driving transistor is connected to an inverting input terminal of the operational amplifier.

6. A delay circuit which causes a delay from a start of charging with electricity to a delayed output by a predetermined time, the delay circuit comprising:
   the current source circuit according to claim 1;
   a capacitor configured to be charged with an output current from the current source circuit; and
   a comparator configured to output a comparative result as the delayed output by comparing a charging voltage of the capacitor with a predetermined threshold.

7. An oscillating circuit comprising:
   the current source circuit according to claim 1;
   a capacitor configured to be charged by an output current from the current source circuit;
   a first switch configured to discharge the capacitor;
   a comparator configured to compare a charging voltage of the capacitor with a first threshold or a second threshold and output a comparative example; and
   a second switch configured to generate any one of the first threshold and the second threshold to be supplied to the comparator,
   wherein turning-on of the first switch or the second switch is determined depending on the comparative example output from the comparator.

8. An oscillating circuit comprising:
   the current source circuit according to claim 1;
   a plurality of inverters and an output inverter, connected in a form of a ring, to which an operation current is supplied from the current source circuit; and
   a plurality of capacitors provided between the plurality of inverters and the output inverter while maintaining a predetermined potential in the plurality of capacitors.

9. An oscillating circuit comprising:
   the current source circuit according to claim 1;
   a capacitor configured to be charged by an output current from the current source circuit;
   a comparator configured to compare the voltage of the capacitor with a predetermined reference voltage; and
   a switching element configured to discharge an electric charge in the charged capacitor based on a result of the comparing obtained by the comparator.

* * * * *